United States Patent
Hwang et al.

(10) Patent No.: US 7,432,745 B2
(45) Date of Patent: Oct. 7, 2008

(54) GATE DRIVER CIRCUIT

(75) Inventors: Jong-Tae Hwang, Seoul (KR); Yun-Kee Lee, Gyeonggi-do (KR); Dong-Hwan Kim, Gyeonggi-do (KR)

(73) Assignee: Fairchild Korea Semiconductor, Ltd., Bucheon (KR)

( * ) Notice: Subject to any disclaimer, the term of this patent is extended or adjusted under 35 U.S.C. 154(b) by 0 days.

(21) Appl. No.: 11/218,384

(22) Filed: Sep. 2, 2005

(65) Prior Publication Data
US 2006/0049859 A1    Mar. 9, 2006

(30) Foreign Application Priority Data
Sep. 3, 2004    (KR) .................. 10-2004-0070287

(51) Int. Cl.
*H03K 3/00*    (2006.01)
(52) U.S. Cl. ...................... 327/108; 327/326
(58) Field of Classification Search ........... None
See application file for complete search history.

(56) References Cited

U.S. PATENT DOCUMENTS

| | | | |
|---|---|---|---|
| 6,734,706 B2* | 5/2004 | Yoshida et al. | 327/108 |
| 6,885,225 B2* | 4/2005 | Ohmichi et al. | 327/112 |
| 2002/0149401 A1* | 10/2002 | Hall et al. | 327/108 |
| 2003/0048116 A1* | 3/2003 | Suetsugu | 327/112 |

\* cited by examiner

*Primary Examiner*—Quan Tra
*Assistant Examiner*—Khareem E. Almo
(74) *Attorney, Agent, or Firm*—Sidley Austin LLP

(57) ABSTRACT

A high voltage gate driver circuit according to an embodiment of the present invention controls an operational range of an output signal of a level shifter to be appropriate for an operational range of a reshaper through a VIV converter. Even though the voltage range of the signal which is input from the high voltage gate driver circuit to the level shifter is different from the operational range of the reshaper, the input signal can always be recognized exactly regardless of the VTH voltage of the reshaper by controlling the operational range of the signal through the VIV converter. In addition, incorrect operation of the circuit can be prevented by erasing a common mode noise which is input with the input signal.

23 Claims, 11 Drawing Sheets

GATE DRIVER CIRCUIT

CROSS-REFERENCE TO RELATED APPLICATION

This application claims priority to and the benefit of Korean Patent Application 10-2004-0070287 filed in the Korean Intellectual Property Office on Sep. 3, 2004, the entire content of which is incorporated herein by reference.

BACKGROUND OF THE INVENTION (a) Field of the Invention

The present invention relates to a high voltage gate driver circuit.

(b) Description of the Related Art

A high voltage gate driver is a circuit for receiving a low voltage signal and controlling a high voltage element coupled to an output terminal.

FIG. 1 is a circuit diagram showing a high voltage gate driver according to previously developed techniques. As shown in FIG. 1, the conventional high voltage gate driver circuit includes transistors M1 and M2, a level shifter 11 including resistors R1 and R2, reshapers 12 and 13, an S-R latch 14, and a gate driver 15.

MOSFETs, which can withstand high voltage, are used for the transistors M1 and M2. The transistors M1 and M2 are driven by a short pulse signal in order to reduce power consumption because high voltages are applied to the transistors M1 and M2. A low voltage element having the ability to withstand approximately 20V in voltage is used for the resistors R1 and R2, the reshapers 11 and 12, the S-R latch 14, and the gate driver 15.

A conventional high voltage gate driver circuit is operated as follows. When the transistor M1 or the transistor M2 is turned on according to an external SET signal or a RESET signal, a voltage is generated on one end of the resistor R1 or the resistor R2 coupled to the reshapers 12 and 13. The reshapers 12 and 13, which have respective predetermined threshold voltages VTH, detect voltage changes across the resistors R1 and R2, and restore the SET/RESET signals that are applied in a low voltage region to a high voltage region. The output voltages of the reshapers 12 and 13 are input to the S-R latch 14. The S-R latch 14 stores a status of the SET/RESET signals. A signal output by the S-R latch 14 is input to the gate driver 15, which in turn drives a gate of a high voltage output element MO coupled to an output terminal.

The reshapers 12 and 13 have the respective threshold voltages VTH. Therefore, the reshapers 12 and 13 will only recognize the input voltages SETB and RESETB as pulse signals when the change of these input voltages exceeds the threshold voltages VTH. Accordingly, the condition VB>VBS−VTH establishes the minimum voltage VB that the reshapers 12 and 13 are able to recognize for a normal operation of the high voltage gate driver circuit.

Generally, when VTH is set to be high, in other words when VTH is near to VB, the reshapers 12 and 13 are able to operate even when VB has a lower value. However, when VTH is set to be high, noise originating from VB may occur, and the reshapers 12 and 13 may operate incorrectly. Therefore, VTH should be set as low as possible, and the reshapers 12 and 13 should be set to operate when SETB and RESETB have become low enough such that noise does not cause the reshapers 12 and 13 to operate incorrectly.

However, VB is not a fixed voltage but rather is a voltage determined by an external power source VBS and a voltage VS. More particularly, the voltage VS may go below 0V when the transistors M1 and M2 switch. This could occur when an inductor is coupled to the output terminal, or by a parasitic inductance of a wire. When the voltage VS goes below 0V, the voltage VB also decreases.

Afterward, when the SET signal is input, the transistor M1 is turned on and a SETB signal is applied to the reshaper 12. When the SETB signal swings from VB to 0V, as shown in FIG. 2, the reshaper 12 may recognize the SETB signal correctly when the threshold voltage is VTH1 (i.e., over 0V), but the reshaper 12 cannot correctly recognize the SETB signal when the threshold voltage is VTH2 (i.e., under 0V).

Moreover, when a voltage VB having a large value of dv/dt (i.e., high slope) is applied, a current for recharging a parasitic capacitor formed on the drains of the transistor M1 and transistor M2 of the level shifter 11 is generated. This current causes a voltage drop in the resistors R1 and R2. As a result, the SR latch 14 is operated by the voltage change of the resistors R1 and R2, which occurs regardless of the SET/RESET signal.

SUMMARY OF THE INVENTION

According to embodiments of the present invention, a gate driver circuit is provided which is able to recognize the output of a level shifter in an exact and stabe manner.

According to an embodiment of the present invention, a gate driver circuit may include a level shifter, a reshaper, a gate driver, and a converter. In this embodiment, the level shifter outputs a first or a second voltage pulse according to an input SET or RESET signal The reshaper restores the first or the second voltage pulse in a high voltage region. The gate driver generates a signal for driving a gate of a high voltage output element from the restored pulse. The converter, which is coupled between the level shifter and the reshaper, converts the voltage pulse output by the level shifter into a pulse appropriate for an operational range of the reshaper.

According to another embodiment of the present invention, the converter may comprise a first converting part and a second converting part. In this embodiment, the first converting part converts the first or the second voltage pulse output by the level shifter into a first or a second current signal. The second converting part converts the converted current signal into a pulse appropriate for an operationl range of the reshaper.

According to a further embodiment of the present invention, the second converting part may comprise a current to voltage (I/V) converter and an amplifier. In this embodiment, the I/V converter reconverts the converted current to a voltage signal. The amplifier amplifies the reconverted voltage signal to a pulse appropriate for an operational range of the reshaper.

According to a further embodiment of the present invention, the first converting part may comprise a first and a second transistor for respectively receiving the first and the second voltage signals output by the level shifter through gates, and for respectively outputting the first and the second current signals.

According to a further embodiment of the present invention, the first converting part may further comprise a first resistor of which two ends are respectively coupled to a first power source for supplying a third voltage to the reshaper, and the sources of the first and the second transistors.

According to a further embodiment of the present invention, the second converting part may comprise first and second resistors, and first and second transistors. In this embodiment, the first and the second resistors, which are coupled between an output terminal of the first converting part and a first power source for supplying a first voltage to the reshaper, respectively convert the first and the second current signals output by the first converting part into voltage signals. The first and the second transistors, which are, at one end, coupled to a second power source for supplying a second voltage to the reshaper, and coupled to the first power source at the other end, receive the voltage signals converted by the first and the second resistors through gates and amplify the received voltage signals into voltage signals having ranges between the first voltage and the second voltage.

According to a further embodiment of the present invention, the first converter further may comprise a first resistor, a second resistor, a first Zener diode, and a second Zener diode. In such an embodiment, the first resistor is coupled between a source and a gate of the first transistor. The second resistor is coupled between a source and a gate of the second transistor. In the first Zener diode, a cathode is coupled to a first power source and an anode is coupled to the gate of the first transistor. In the second Zener diode, a cathode is coupled to the first power source and an anode is coupled to the gate of the second transistor.

According to a further embodiment of the present invention, the reshaper, which is supplied with a voltage from a first power source and a second power source, receives a first or a second voltage pulse, restores the first or the second voltage pulse in a high voltage region, and outputs the restored pulses. The gate driver generates a signal for driving a gate of a high voltage output element from the restored pulse. The converter, which is coupled between the level shifter and the reshaper, erases a noise input from the first power source and converts the voltage pulse output by the level shifter into a pulse appropriate for an operational range of the reshaper.

According to a further embodiment of the present invention, the converter may include a noise eraser, a first converting part, and a second converting part. In this embodiment, the noise eraser detects and erases the noise input from the first power source. The first converting part converts the first or the second voltage pulse output by the level shifter into a first or a second current signal. The second converting part converts the converted current signal into a voltage pulse appropriate for an operational range of the reshaper.

According to a further embodiment of the present invention, the noise eraser may include a noise detector and three transistors. In this embodiment, the noise detector detects an amount of current caused by the noise, and the current is output by the first converting part. In the first to third transistors, their respective gates and sources are coupled to the same potential. Here, the noise eraser absorbs the current caused by the noise output by the first converting part because a current detected by the noise detector flows through the first transistor, and the current flowing through the first transistor is copied by the second and the third transistors.

According to a further embodiment of the present invention, the first converting part may include a fourth and a fifth transistor, a first resistor, a second resistor, and a third resistor. In this embodiment, the fourth and the fifth transistors respectively receive the first and the second voltage signals through gates, convert the received voltage signals into the first and the second current signals, and output them. In the first resistor, its ends are respectively coupled to the first power source and the fourth and the fifth transistors. The second resistor is coupled between a source and a gate of the fourth transistor. The third resistor is coupled between a source and a gate of the fifth transistor. Here, the noise detector includes a fourth resistor, a sixth transistor, and a fifth resistor. In the fourth resistor, one end is coupled to the first power source. The sixth transistor is coupled between the other end of the fourth resistor and the first transistor. The fifth resistor is coupled between a source and a gate of the sixth transistor.

According to a further embodiment of the present invention, the level shifter includes a sixth and seventh resistor, and a seventh and eight transistor. In this embodiment, in the sixth resistor is coupled to the first power source at one end. The seventh transistor, which is coupled between the other end of the sixth resistor and a ground, is turned on by the SET signal input to the gate of the seventh transistor. The seventh resistor is coupled at one end to the first power source. The eighth transistor, which is coupled between the other end of the seventh resistor and the ground, is turned on by the RESET signal input to the gate of the eighth transistor. Here, the noise detector may further include an eighth resistor and a ninth transistor which are coupled between the first power source and the ground in series, and its contact node is coupled to a gate of the sixth transistor.

According to a further embodiment of the present invention, the second converting part may include a ninth and tenth resistor, and a tenth and eleventh transistor. In this embodiment, the ninth and the tenth resistors, which are coupled between an output terminal of the first converting part and the second power source, respectively convert the first and the second current signal output by the first converting part into voltage signals. The tenth and the eleventh transistors, which are coupled to the first power source at one end and coupled to the second power source at the other end, receive the voltage signal converted by the first and the second resistors, and amplify them.

According to a further embodiment of the present invention, current capacities of the second and the third transistors may be the same or larger than that of the first transistor.

According to a further embodiment of the present invention, current capacities of the fourth to sixth transistors may be substantially the same, the magnitude of the fourth resistor may be twice that of the first resistor, and the magnitudes of the second, the third, and the fifth resistors may be substantially the same.

According to a further embodiment of the present invention, current capacity of the ninth transistor may be substantially the same or larger than those of the seventh and the eighth transistors, and the magnitudes of the sixth and the seventh resistors may be substantially the same.

According to a further embodiment of the present invention, current capacities of the tenth and the eleventh transistors may be substantially the same, and the magnitudes of the ninth and the tenth resistors may be substantially the same.

According to a further embodiment of the present invention, the noise eraser may include a first, second, third, fourth, fifth, and sixth transistors. In this embodiment, the first voltage pulse is input to a gate of the first transistor. The second voltage pulse is input to a gate of the second transistor. In the third transistor, the drain is coupled to a first current signal output terminal of the first converting part, and its source is coupled to the second power source. The fourth transistor, where a gate is coupled to a gate of the third transistor and a drain is coupled to a drain of the second transistor, forms a current mirror together with the third transistor. In the fifth transistor, its drain is coupled to a second current signal output terminal of the first converting part and its source is coupled to the second power source. The sixth transistor, where a gate is coupled to a gate of the fifth transistor and a drain is coupled to a drain of the first transistor, forms a current mirror together with the third transistor.

According to a further embodiment of the present invention, the first converting part includes a seventh and an eighth transistor, a first, second, and third resistor. In this embodiment, the seventh and the eighth transistors may receive the first and the second voltage signals output by the level shifter through respective gates, and output the first and the second current signals. The first resistor is coupled at one end to the first power source and coupled to sources of the seventh and the eighth transistors at the other end. The second resistor is coupled between a source and a gate of the seventh transistor. The third resistor is coupled between a source and a gate of the eighth transistor. Here, the sources of the first and the second transistors are coupled to the first power source through the first resistor.

According to a further embodiment of the present invention, the second converting part may include a fourth and fifth resistor, and a ninth and tenth transistor. In this embodiment, the fourth and the fifth resistors, which are coupled between an output terminal of the first converting part and the second power source, respectively convert the first and the second current signals output by the first converting part into voltage signals. The ninth and the tenth transistors, which are respectively coupled to the first power source at one end, and respectively coupled to the second power source at the other end, receive the voltage signals converted by the fourth and the fifth resistors through respective gates and amplify them.

According to a further embodiment of the present invention, current capacities of the first and the second transistors may be substantially the same or large than those of the seventh and the eighth transistors.

According to a further embodiment of the present invention, current capacities of the third and the fifth transistors may be substantially the same, current capacities of the fourth and the sixth transistors may be substantially the same, and current capacities of the third and the fifth transistors may be substantially the same or larger than those of the fourth and the sixth transistors.

According to a further embodiment of the present invention, magnitudes of the second and the third resistors may be substantially the same.

According to a further embodiment of the present invention, current capacities of the ninth and the tenth transistors may be substantially the same, and magnitudes of the fourth and the fifth resistors may be substantially the same.

Important technical advantages of the present invention are readily apparent to one skilled in the art from the following figures, descriptions, and claims.

BRIEF DESCRIPTION OF THE DRAWINGS

For a more complete understanding of the present invention and for further features and advantages, reference is now made to the following description taken in conjunction with the accompanying drawings, in which.

DETAILED DESCRIPTION OF THE EMBODIMENTS

The embodiments of the present invention and their advantages are best understood by referring to FIGS. 3 through 11 of the drawings. Like numerals are used for like and corresponding parts of the various drawings.

Figure 1:
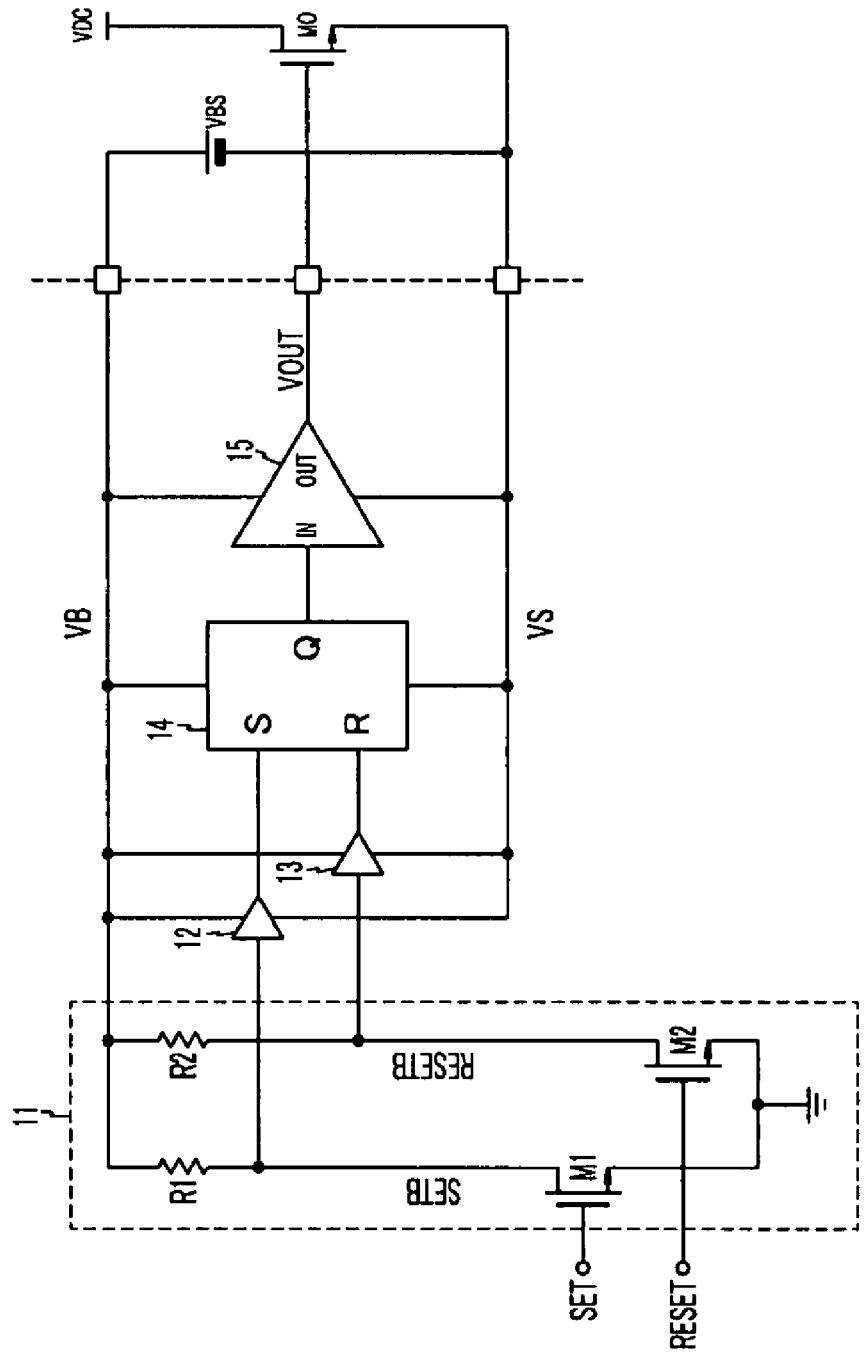
FIG. 1 is a circuit diagram of an exemplary high voltage gate driver circuit diagram according to the prior art.
Figure 2:
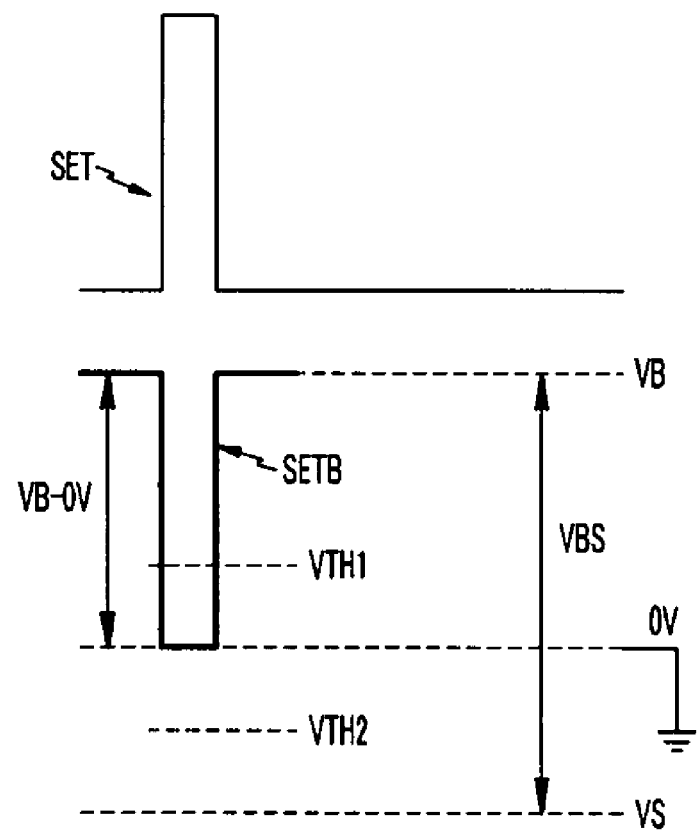
FIG. 2 illustrates the operational range of a reshaper of an exemplary high voltage gate driver circuit according to the prior art.
Figure 3:
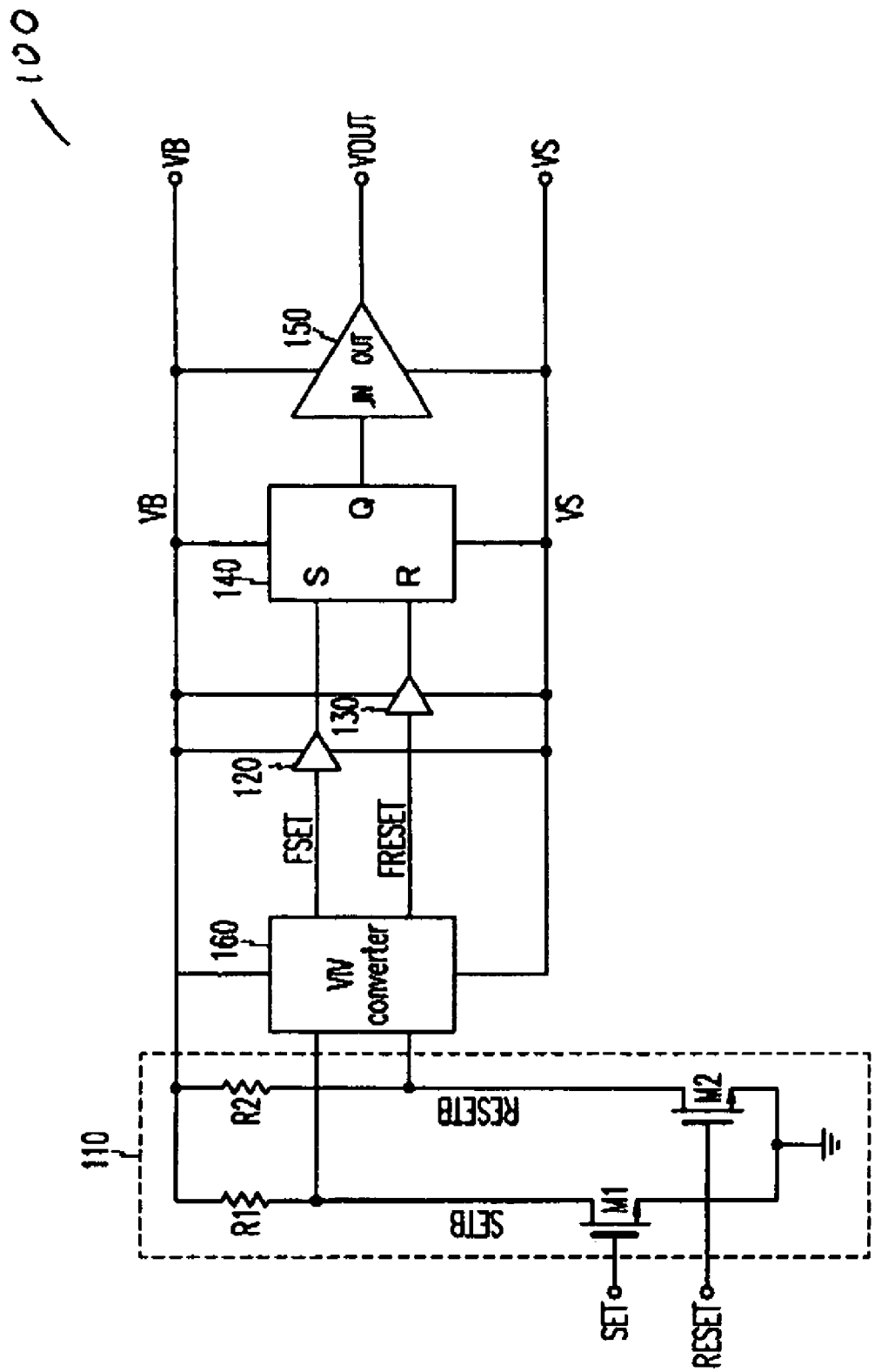
FIG. 3 is an exemplary implementation of a gate driver circuit, according to an embodiment of the present invention.
Figure 4:
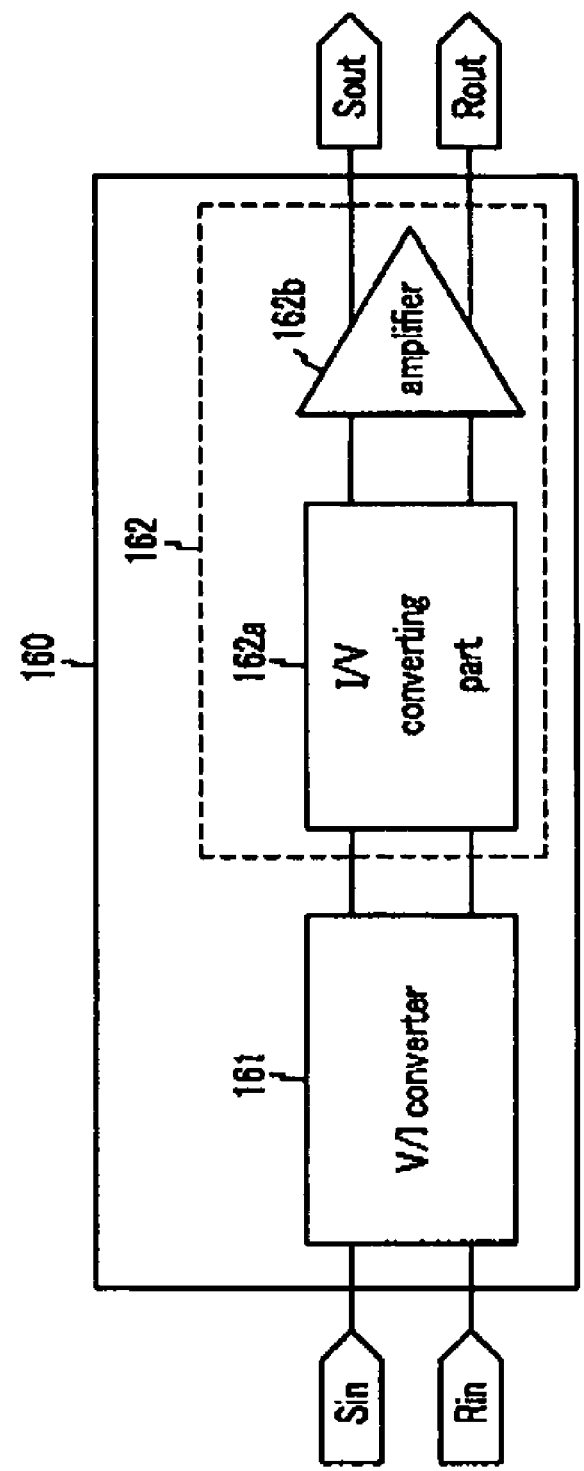
FIG. 4 is a block diagram of an exemplary implementation of a converter, according to an embodiment of the present invention.

FIG. 3 shows an exemplary implementation of a gate driver circuit 100 according to an embodiment of the present invention, and FIG. 4 shows an exemplary implementation of a converter 160 according to an embodiment of the present invention.

As shown in FIG. 3, the gate driver circuit 100 according to an exemplary embodiment of the present invention includes the converter 160 which is coupled between the output terminal of a level shifter 110 and the input terminals of reshapers 120 and 130.

As shown in FIG. 4, the converter 160 according an exemplary embodiment of the present invention includes a V/I converter (voltage to current converter) 161 and an I/V converter (current to voltage converter) 162. Hereinafter, the converter 160 according to the exemplary embodiment of the present invention will be referred to as a "VIV converter". The I/V converter 162 includes a current/voltage converting part 162a and an amplifier 162b.

As described above, in the conventional high voltage gate driver circuit, the level shifter 110 operates in the range of 0V to VB, while the reshapers 120 and 130 operate in the range of VB to VS. Since the operational ranges of the level shifter 110 and the reshapers 120 and 130 are different, there is a problem in that the reshapers 120 and 130 may not recognize the output signal of the level shifter 110 accurately.

To solve this problem, the V/I converter 161 converts an output voltage of the level shifter 110 into a current, the current/voltage converting part 162a of the I/V converter 162 converts the converted current into a voltage, and the amplifier 162b amplifies the converted voltage into a voltage between VB and VS (which is appropriate for the operation of the reshapers 120 and 130), and outputs the amplified voltage.

An exemplary implementation and operation of the VIV converter 160 according to the an embodiment of the present invention will described in detail with reference to FIGS. 5 and 6.

Figure 5:
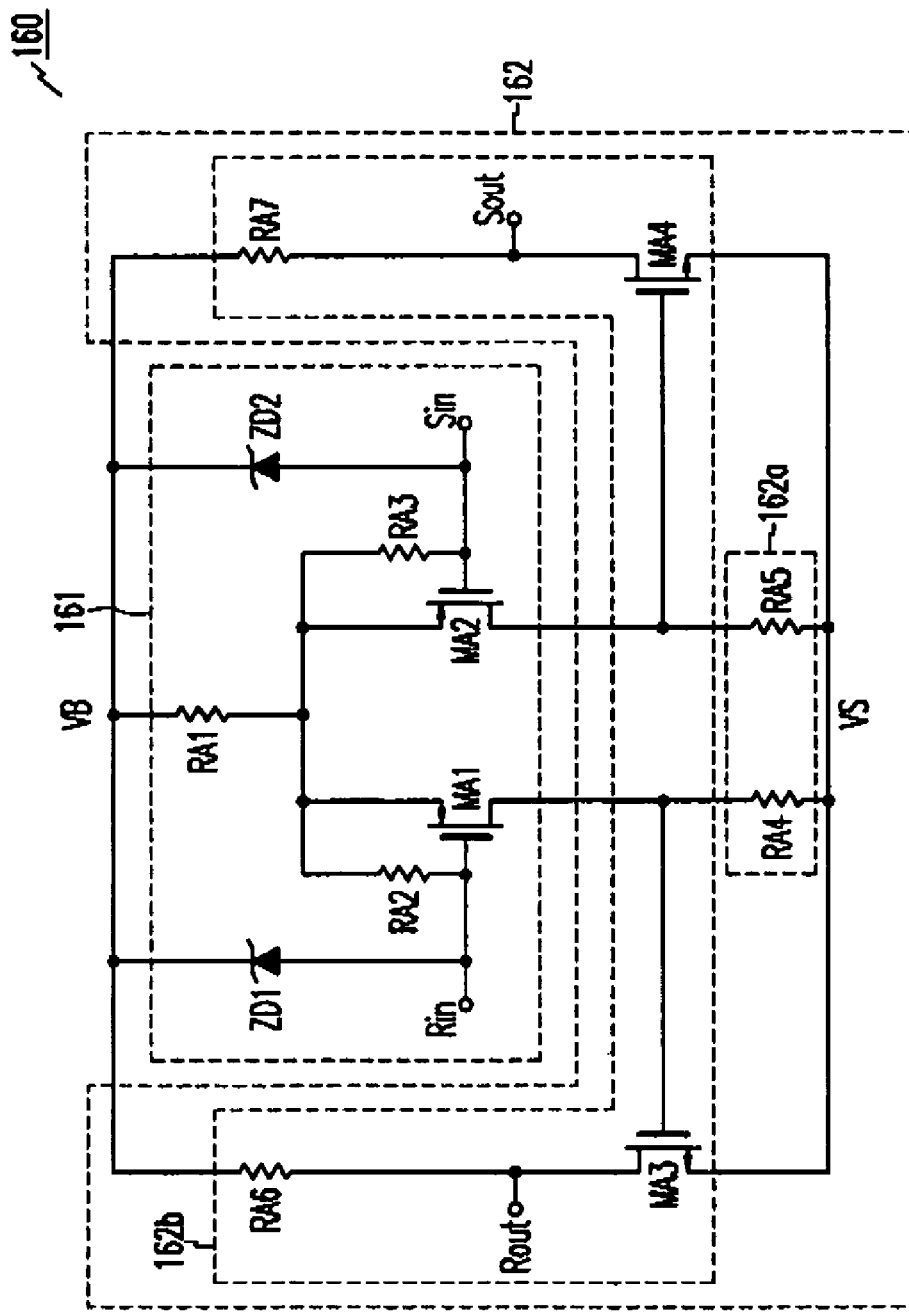
FIG. 5 is a schematic diagram of an exemplary implementation of a VIV converter, according to an embodiment of the present invention.

FIG. 5 is a schematic diagram of an exemplary implementation of a VIV converter 160, according to an embodiment of the present invention.

As shown in FIG. 5, the V/I converter 161 of the VIV converter 160 may include transistors MA1 and MA2, resistors RA1, RA2, and RA3, and Zener diodes ZD1 and ZD2.

The transistors MA1 and MA2 convert voltage input at gates, which are input terminals Sin and Rin, into currents. The resistors RA1, RA2, and RA3 control the amount of current flowing through the transistors MA1 and MA2. In particular, the resistor RA1 is coupled to sources of the transistor MA1 and the transistor MA2, and allows the transistors MA1 and MA2 to operate as differential amplifiers. In such a manner, when either one of the transistor MA1 or the transistor MA2 is turned on, the other will be turned off. The resistor RA1 controls the maximum current flowing through the transistor MA1 and the transistor MA2.

The resistor RA2 and the resistor RA3 are respectively coupled between the gate and the source of the transistor MA1 and between those of the transistor MA2. Resistors RA2 and RA3 distribute voltage supplied from the resistor RA1, and also decrease the current flowing through the resistor RA1.

The Zener diodes ZD1 and ZD2 are coupled to the gates of the transistors MA1 and MA2 (i.e., input terminals Sin and Rin), and prevent the transistors MA1 and MA2 from being damaged by a change of voltage supplied to the input terminals Sin and Rin.

The I/V converter 162 of the VIV converter 160 may include the current/voltage converting part 162a and the amplifier 162b. The current/voltage converting part 162a may include resistors RA4 and RA5, which are respectively coupled between the output terminal of the V/I converter 161 and VS. The amplifier 162b may include a resistor RA6 and a transistor MA3, and a resistor RA7 and a transistor MA4, which are respectively coupled in series between VS and VB. The gates of the transistor MA3 and the transistor MA4 are coupled to the output terminal of the V/I converter 161.

The resistors RA4 and RA5 convert a current output by the V/I converter 161 to a voltage, and the converted voltage is applied to the gates of the transistors MA3 and MA4. The converted voltage is amplified by the transistors MA3 and MA4, and is output to the output terminals Sout and Rout of the VIV converter 160.

Figure 6:
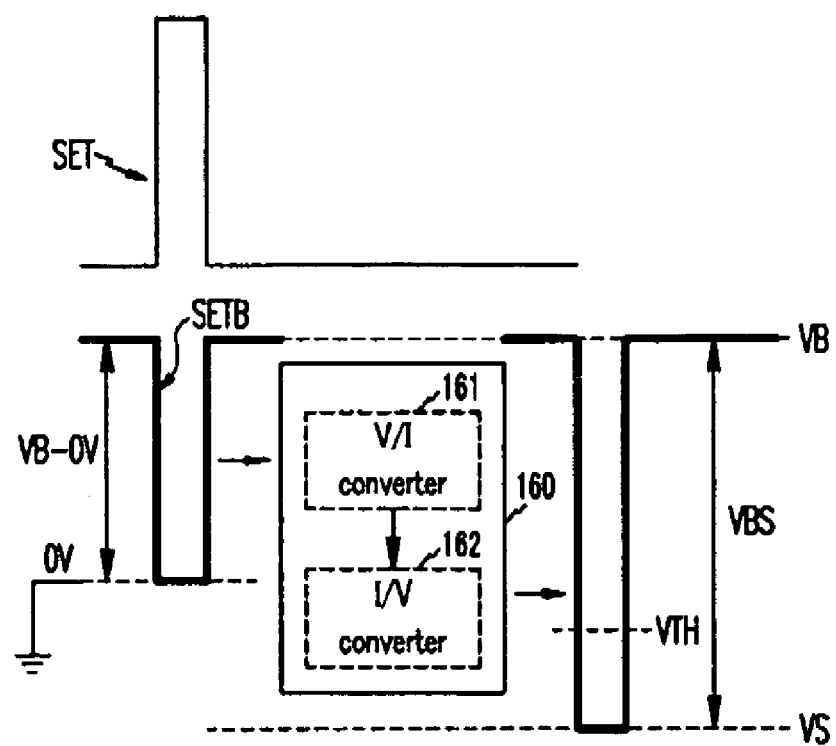
FIG. 6 illustrates an exemplary signal converting operation of the VIV converter in the gate driver circuit, according an embodiment of the present invention.

FIG. 6 illustrates an exemplary signal converting operation of the VIV converter 160 in the gate driver circuit, according an embodiment of the present invention. In more detail, FIG. 6 illustrates a signal that is converted by the VIV converter 160 when the maximum swing width of the output of the level shifter is limited between VB and 0V because VS voltage becomes a negative voltage and VB becomes low.

When the SET signal is input to the input terminal SET of the gate driver circuit 100, the transistor M1 is turned on, and a voltage signal is input to the input terminal Sin of the VIV converter 160 through the resistor R1. Here, the signal input to the input terminal Sin of the VIV converter 160 is a pulse signal swinging from VB to 0V, as shown in FIG. 6. This pulse signal is converted into a current signal by the V/I converter 161 of the VIV converter 160. The converted current signal is converted into a voltage signal by the I/V converter 162, and is amplified to be a signal swinging from VB to VS. Then the amplified signal is output through the output terminal Sout, and then is input to the reshaper 120.

As described above, according to an exemplary embodiment of the present invention, because a signal is converted to an appropriate range for the operation of the reshaper 120 by the VIV converter 160 regardless of the voltage range of the signal input to the level shifter 110, the reshaper 120 will recognize the input signal iaccurately, regardless of the VTH voltage of the reshaper 120.

In the gate driver circuit 100 according to an exemplary embodiment of the present invention, the transistors M1 and M2 to be turned on by the SET/RESET signal may respectively include a parasitic capacitor coupled to each drain (not shown). When a common mode noise is input to the VB line, a recharging current flows from the resistors R1 and R2 to the parasitic capacitor in order to recharge the parasitic capacitor coupled to the transistors. In particular, when the common mode noise having a high dv/dt is input through the VB line by the recharging current, a voltage sufficient to make the S-R latch 140 operate may be generated in the resistors R1 and R2. This may cause the circuit to operate incorrectly.

Therefore, a VIV converter 170 of the gate driver circuit 100 according to another exemplary embodiment of the present invention may include a V/I converter 171, an I/V converter 172, and a noise eraser 173 for erasing the common mode noise.

Figure 7:
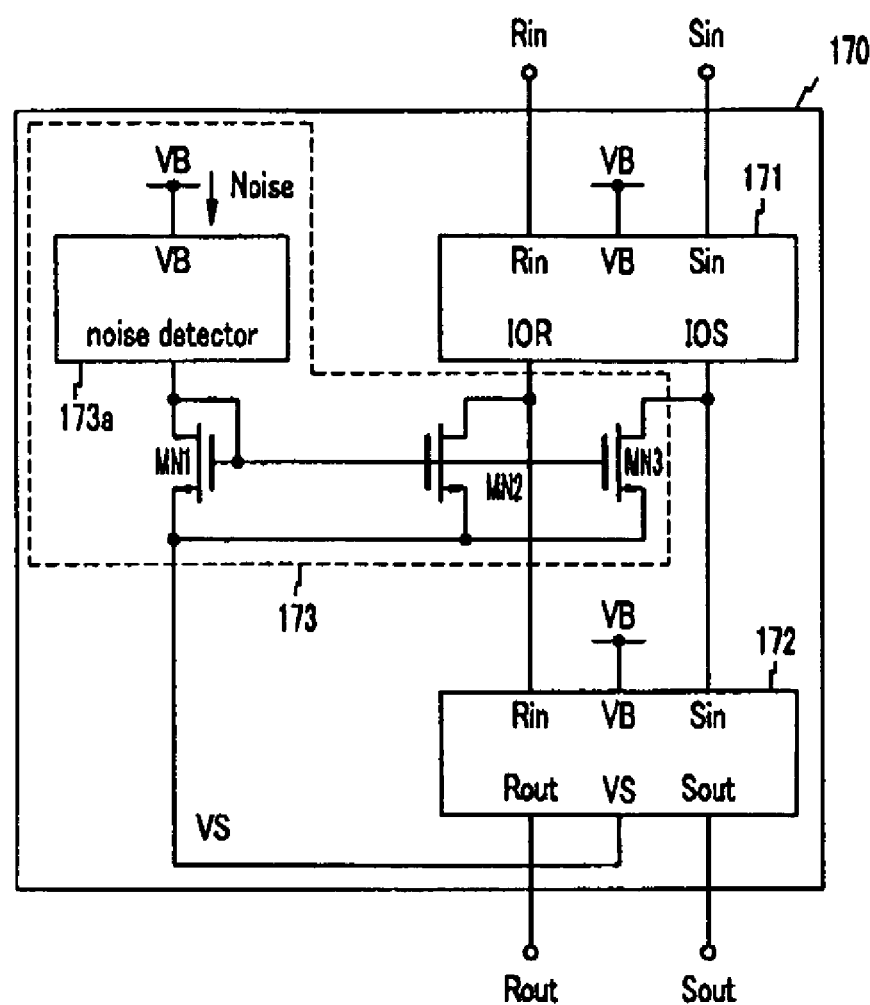
FIG. 7 is a schematic diagram, in partial block form, of an exemplary implementation of a VIV converter, according to another embodiment of the present invention.

FIG. 7 is a schematic diagram, in partial block form, of an exemplary implementation of a VIV converter 170, according to another embodiment of the present invention.

As shown in FIG. 7, the noise eraser 173 of the VIV converter 170 may include a noise detector 173a for detecting noise input to the VB line, a transistor MN1 coupled to an output terminal of the noise detector 173a, and transistors MN2 and MN3 respectively coupled to output terminals IOR and IOS of the V/I converter 171. Gates of the transistors MN1, MN2, and MN3 are all coupled to the same potential.

When noise is input to the VB line, the current of which is the same as the current output from IOR or IOS by the noise flows through the transistor MN1. Because the gates and the sources of the transistors MN1, MN2, and MN3 are coupled to the same potential, the current flowing through the transistor MN1 can be applied to the transistors MN2 and MN3. Therefore, the current output by the IOR or IOS flows respectively through the transistor MN2 or the transistor MN3. As a result, the application of the current caused by the noise to input terminals Rin and Sin of the I/V converter 172 can be avoided, and the incorrect operation of the circuit caused by the noise may be prevented.

Figure 8:
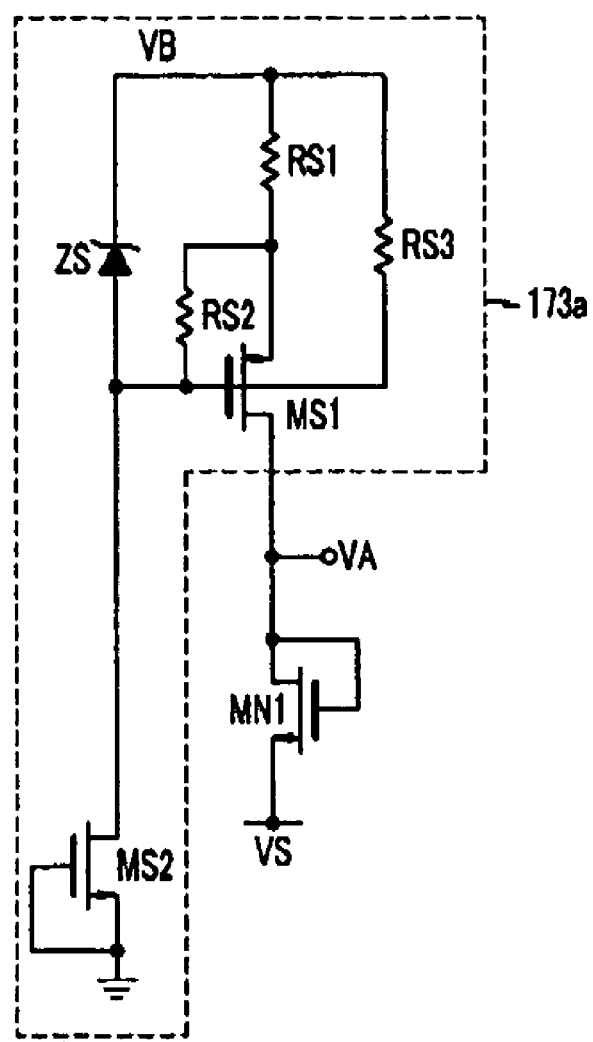
FIG. 8 is a schematic diagram of an exemplary implementation of a noise detector, according to an embodiment of the present invention.

FIG. 8 is a schematic diagram of an exemplary implementation of a noise detector 173a, according to an embodiment of the present invention.

As shown in FIG. 8, the noise detector 173a may be designed to have the same format as the V/I converter 171 in order to measure the amount of current caused by the common mode noise input to the VIV converter. Even though the V/I converter 171 may include resistor RA1, resistors RA2 and RA3, transistors MA1 and MA2, and Zener diodes ZD1 and ZD2 (which are for converting the signals SETB and RESETB output by the resistors R1 and R2 of the level shifter 110), the noise detector 173a only needs to detect one signal (i.e., the common mode noise signal). Therefore, the noise detector 173a may include a resistor RS1 corresponding to the resistor RA1, a resistor RS2 corresponding to the resistor RA2 or RA3, a transistor MS1 corresponding to the transistors MA1 or MA2, a Zener diode ZS corresponding to the Zener diodes ZD1 or ZD2, a transistor MS2 corresponding to the transistors M1 or M2, and a resistor RS3 corresponding to the resistor R1 or R2. A node VA of the transistor MS1 and transistor MN1 may be coupled to the gates of the transistor MN2 and the transistor MN3. Here, each element of the noise detector 173a may have the same characteristic values as those of corresponding elements of the level shifter 110 and V/I converter 171.

In the noise detector 173a of such implementation, the common mode noise having a high dv/dt is input to the VB line, the recharging current is generated through the resistor RS3 and the transistor MS2, and a voltage difference is generated at the resistor RS3. The transistor MS1 converts the voltage into a current. The converted current is designed to be easily copied by the transistor MN2 and the transistor MN3 by the transistor MS1.

Figure 9:
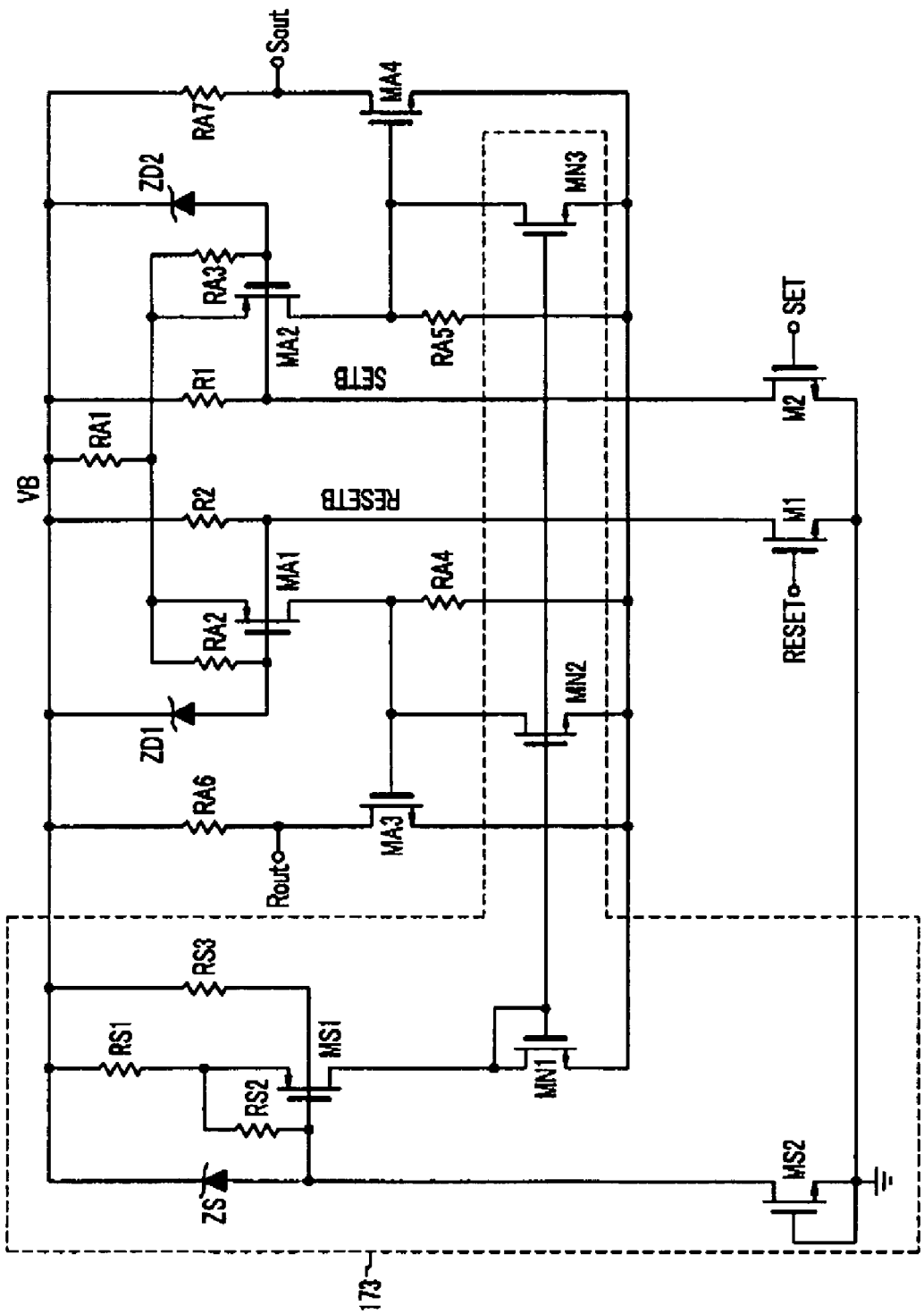
FIG. 9 is a schematic diagram of an exemplary implementation of a level shifter and a VIV converter including a noise eraser, according to an exemplary embodiment of the present invention.

FIG. 9 is a schematic diagram of an exemplary implementation of a level shifter 110 and a VIV converter 170 including a noise eraser 173, according to an exemplary embodiment of the present invention.

In the gate driver circuit 100 according to an exemplary embodiment of the present invention, since the current for recharging the parasitic capacitor of the transistors M1 and M2 of the level shifter flows when the common mode noise is input to the VB line, a voltage difference may occur at both ends of the resistor R1 and R2. The voltage difference may be converted to a current through the transistors MA1 and MA2 of the V/I converter, and when the converted current flows to the resistors RA4 and RA5, the transistors MA3 and MA4 of the I/V converter can be turned on.

However, as shown in FIG. 9, the high voltage gate driver circuit according to an exemplary embodiment of the present invention may include the noise eraser 173. Therefore, when the common mode noise is input to the VB line, the same current as the current flowing through the transistors M1 and M2 of the level shifter flows to the transistor MS2 of the noise eraser 173, a voltage difference occurs at the resistor RS3, and the voltage difference is converted into a current by the transistor MS1 of the noise eraser 173. Here, a current of the same magnitude as the current flowing through the transistors MA1 and MA2 of the V/I converter flows to the transistor MS1, and this current is input to the transistor MN1.

As described above, since the gates and sources of the transistors MN2 and MN3 are coupled to the same potential as the gate and source of the transistor MN1, the current flowing in the transistor MN1 (i.e., the current having the same magnitude as the current flowing through the transistors MA1 and MA2 of the V/I converter) flows through the transistors MN2 and MN3. Since most of the current flowing through the transistors MA1 and MA2 of the V/I converter, which is caused by the common mode noise, flows to the transistors MN2 and MN3 of the I/V converter, whose gates are coupled to drains, the current may not adequately flow to the gates of the transistors MA3 and MA4, and the transistors MA3 and MA4 may not be turned on. The incorrect operation of the S-R latch caused by the common mode noise input through the VB line can therefore be prevented.

When the current flowing through the transistors MN2 and MN3 is larger than the current flowing through the transistor MN1, the current caused by the noise may be effectively erased. It is thus preferable to use a transistor having a larger capacity than those of the transistors MN2 and MN3 for the transistor MN1. Moreover, when more current is detected than is actually input in the noise eraser 173, the current caused by the noise may be erased more effectively. It is preferable to use a transistor having a larger capacity than those of the transistors M1 and M2 of the level shifter for the transistor MS2 of the noise eraser 173.

As described above, according to an exemplary embodiment of the present invention, the reshaper 120 may consistently recognize the input signal in an exact manner by using the VIV converter regardless of the VTH voltage of the reshaper 120. This means that the incorrect operation of the high voltage gate driver circuit caused by the common mode noise may be prevented.

At the same time, the noise detector 173 according to an exemplary embodiment of the present invention may need to use the high voltage transistor MS2, which is the same as the high voltage transistors M1 and M2 or has higher performance, in order to detect the current caused by the common mode noise.

Another exemplary embodiment of the present invention provides a VIV converter which may include a noise eraser for effectively erasing the common mode noise without using a high voltage transistor.

Figure 10:
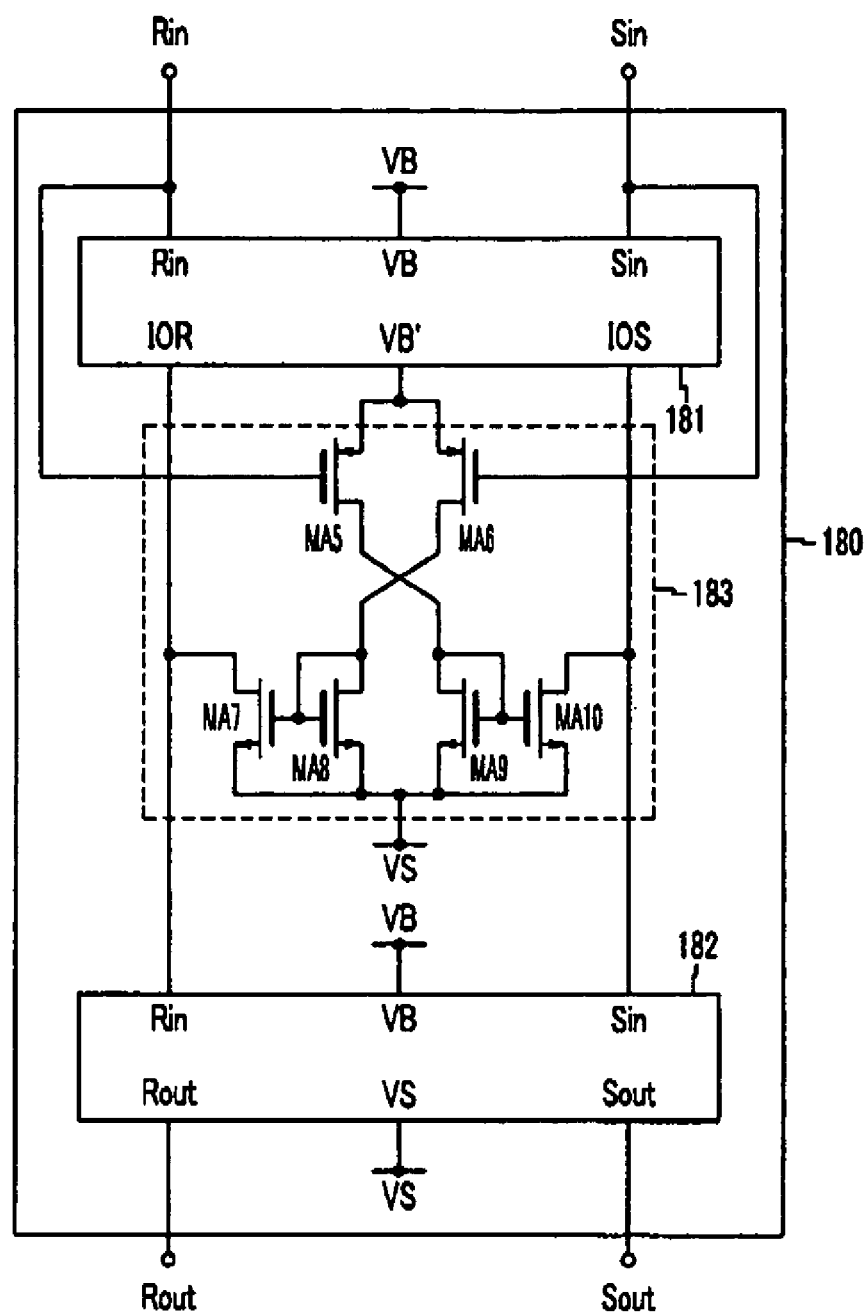
FIG. 10 is a schematic diagram, in partial block form, of an exemplary implementation of a VIV converter, according to an embodiment of the present invention.

FIG. 10 shows the structure of an exemplary VIV converter 180 according to an embodiment of the present invention.

As shown in FIG. 10, the noise eraser 183 of the VIV converter 180 may include six transistors MA5, MA6, MA7, MA8, MA9, and MA10.

Drains of the transistors MA7 and MA10 are respectively coupled to output ends IOR and IOS of the V/I converter 181. Gates and drains of the transistors MA8 and MA9 are coupled to each other, sources of the transistors MA7, MA8, MA9, and MA10 are coupled to the same potential VS, and gates of the transistors MA8 and MA9 are respectively coupled to gates of the transistors MA7 and MA10. Current mirrors are formed as a result. Drains of the transistors MA8 and MA9 are coupled to the drains of the transistors MA6 and MA5, sources of the transistors MA6 and MA5 are coupled to the sources of the transistors MA1 and MA2 (not shown) of the V/I converter 181, and gates of the transistors MA6 and MA5 are coupled to input terminals Rin and Sin of the V/I converter 181. This enables a current, which is substantially equivalent to the current flowing through the output terminals IOR and IOS of the V/I converter 181 to flow through the drains of the transistors MA6 and MA5.

In the VIV converter 180 according to an exemplary embodiment of the present invention, the current, which has the same magnitude as the current output by the V/I converter 181, flows to the transistors MA6 and MA5 because of the noise signal. This current is absorbed by the transistors MA7, MA8, MA9, and MA10. As a result, the current caused by the noise signal may not be input to the input terminals Rin and Sin of the I/V converter 182.

Figure 11:
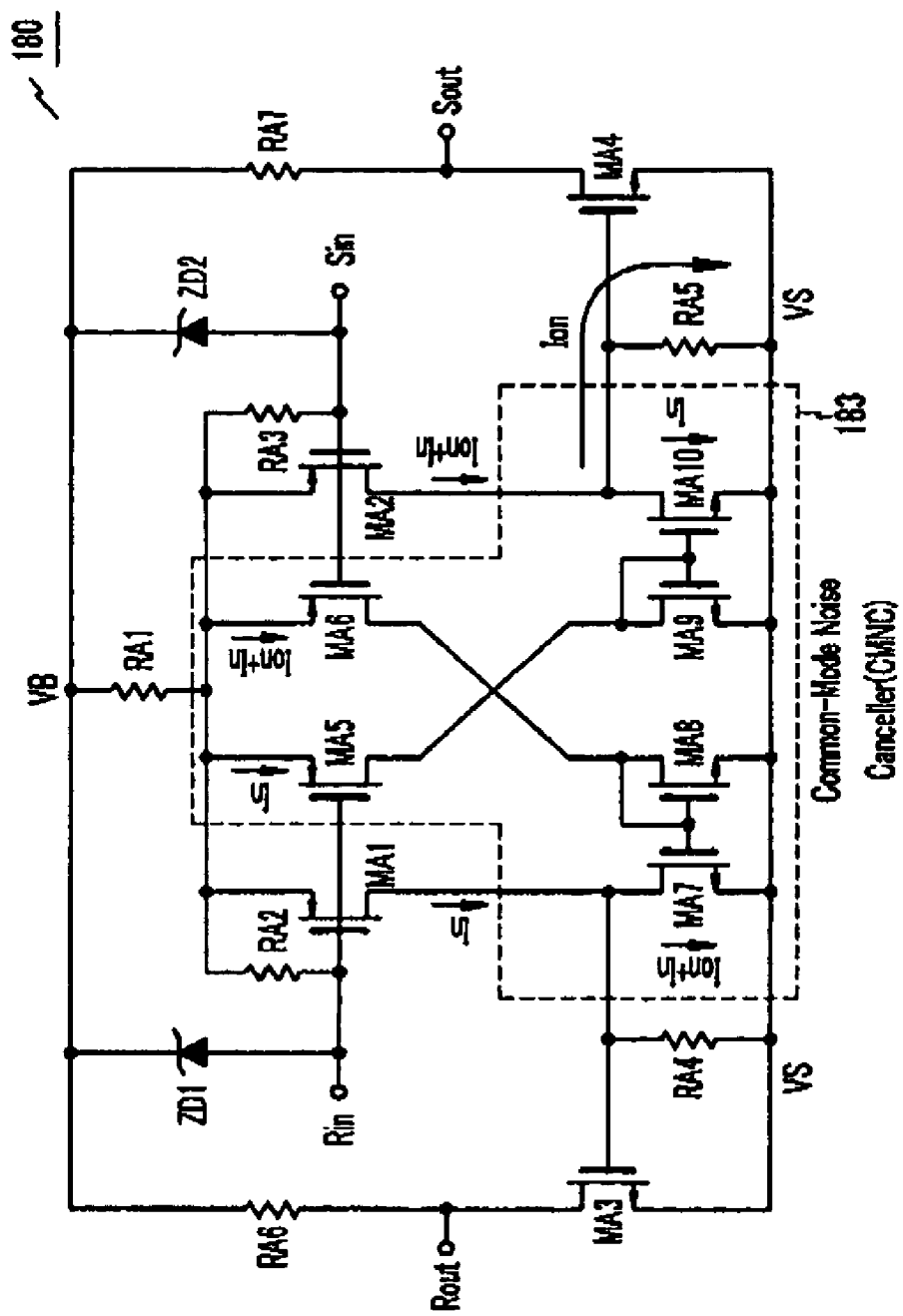
FIG. 11 is a schematic diagram of an exemplary implementation of a VIV converter including a noise eraser, according to an exemplary embodiment of the present invention.

FIG. 11 is a schematic diagram of an exemplary implementation of a VIV converter 180 including a noise eraser, according to an exemplary embodiment of the present invention.

In the gate driver circuit, the transistors M1 and M2 are turned off when there is no signal input to the level shifter 110. When the common mode noise having a high dv/dt is input to the VB line, the transistors M1 and M2 form the current for recharging the parasitic capacitor coupled to the drains. A voltage difference could then occur between the resistors R1 and R2. This voltage difference could cause a current to flow in the transistors MA1 and MA2 of the V/I converter to the resistors RA4 and RA5 of the I/V converter. The transistors MA3 and MA4 may then operate as a result.

However, the VIV converter 180 according to an exemplary embodiment of the present invention may include the noise eraser 183. The current flowing in the transistors MA1 and MA2 can be absorbed by the transistors MA7 and MA10 of the noise eraser 183. In this case, the transistors MA3 and MA4 do not operate.

In addition, when the SET signal is input to the level shifter with the common mode noise, as shown in FIG. 11, a current Ion+In, which is a sum of a current Ion caused by the SET signal and a current In caused by the noise, flows in transistor MA2, whereas only the current In caused by the noise flows in the transistor MA1.

At this moment, the current In, which is the same as the current flowing in the transistor MA1 of the V/I converter, flows in the transistor MA5 of the noise eraser 183, and the current Ion+In, which is the same as the current flowing in the transistor MA2 of the V/I converter, flows in the transistor MA6 of the noise eraser 183.

Since the drain of the transistor MA5 may be coupled to the drain of the transistor MA9, and the drain of the transistor MA6 may be coupled to the drain of transistor MA8, the current Ion+In, which is the same as the current flowing in the transistor MA6, flows in the transistor MA8. The current In, which is the same as the current flowing in the transistor MA5, flows in the transistor MA9.

In addition, since the transistor MA7 and the transistor MA8, and the transistor MA9 and the transistor MA10, form current mirrors, the current Ion+In, which is the same as the current flowing in the transistor MA8, flows in the transistor MA7. The current In, which is the same as the current flowing in the transistor MA9, flows in the transistor MA10.

In other words, because the current Ion+In flows in the drain of the transistor MA7, and the current In output by the transistor MA1 is smaller than the current Ion+In, the current In, which is caused by the noise and is output by the transistor MA1, is entirely absorbed by the transistor MA7 of the noise eraser 183. Therefore, very little current flows to the resistor RA4, and so the transistor MA3 of the I/V converter may remain turned off.

In addition, the current In flows in the drain of the transistor MA10, and the transistor MA2 provides the current Ion+In. Therefore, in the current output by the transistor MA1 of the V/I converter, the current In caused by the noise is absorbed by the transistor MA10 of the noise eraser 183, and only the current Ion caused by the SET signal flows to the resistor RA5 of the IN converter. The transistor MA4 is not affected by the noise.

Similar to the second exemplary embodiment of the present invention, in the VIV converter according to an exemplary embodiment of the present invention, when the currents flowing to the transistors MA5 and MA6 are larger than the currents flowing to the transistors MA1 and MA2, the current caused by the noise may be erased more effectively. Therefore, it is preferable for the transistors MA5 and MA6 to use transistors having larger capacity than the transistors MA1 and MA2. In addition, in the current mirror of the noise eraser 183 according to an exemplary embodiment of the present invention, when the transistors MA7 and MA10 absorbing the currents output by the V/I converter have larger capacity than the transistors MA8 and MA9 absorbing the currents output by the transistors MA5 and MA6, the current caused by the noise may be erased more effectively.

As described above, according to an exemplary embodiment of the present invention, the common mode noise may be effectively erased without using the high voltage transistors.

As describe above, according to the present invention, even though the voltage range of the signal which is input from the high voltage gate driver circuit to the level shifter may be different from the operational range of the reshaper, the input signal can always be recognized in a precise manner, regardless of the VTH voltage of the reshaper by controlling the operational range of the signal through the VIV converter.

In addition, incorrect operation of the circuit can be prevented by erasing the common mode noise which is input with the input signal.

Although the present invention and its advantages have been described in detail, it should be understood that various changes, substitutions, and alterations can be made therein without departing from the spirit and scope of the invention as defined by the appended claims. That is, the discussion included in this application is intended to serve as a basic description. It should be understood that the specific discussion may not explicitly describe all embodiments possible; many alternatives are implicit. It also may not fully explain the generic nature of the invention and may not explicitly show how each feature or element can actually be representative of a broader function or of a great variety of alternative or equivalent elements. Again, these are implicitly included in this disclosure. Where the invention is described in device-oriented terminology, each element of the device implicitly performs a function. Neither the description nor the terminology is intended to limit the scope of the claims.

What is claimed is:

1. A gate driver circuit comprising:
    a level shifter for outputting a first voltage pulse or a second voltage pulse according to an input SET or RESET signal;
    a reshaper for restoring the first or the second voltage pulse in a high voltage region;
    a gate driver for generating a signal for driving a gate of a high voltage output element from the restored pulse; and
    a converter, which is directly coupled between an output of the level shifter and an input of the reshaper, for converting the voltage pulse output by the level shifter into a pulse appropriate for an operational range of the reshaper, wherein the converter comprises
    a first converting part for converting the first voltage pulse or the second voltage pulse output by the level shifter into a first or a second current signal; and
    a second converting part for converting the converted current signal into a voltage pulse appropriate for an operational range of the reshaper, wherein
    the first converting part comprises at least one Zener diode.

2. The gate driver circuit of claim 1, wherein the second converting part comprises:
    an current/voltage converter for reconverting the converted current to a voltage signal; and
    an amplifier for amplifying the reconverted voltage signal to a voltage pulse appropriate for an operational range of the reshaper.

3. The gate driver circuit of claim 1, wherein the first converting part comprises a first transistor and a second transistor for respectively receiving the first and the second voltage signal output by the level shifter through gates, and respectively outputting the first and the second current signals.

4. The gate driver circuit of claim 3, wherein the first converting part further comprises a first resistor of which two ends are respectively coupled to a first power source for supplying a third voltage to the reshaper and sources of the first and the second transistors.

5. The gate driver circuit of claim 1, wherein the second converting part comprises:
    a first resistor and a second resistor, which are coupled between an output end of the first converting part and a first power source for supplying a first voltage to the reshaper, for respectively converting the first and second current signals output by the first converting part into voltage signals; and
    a first transistor and a second transistor, which are coupled to a second power source for supplying a second voltage to the reshaper at one end, and are coupled to the first power source at the other end, for receiving the voltage signals converted by the first and the second resistors through gates and amplifying the received voltage signals into voltage signals having ranges between the first voltage and the second voltage.

6. The gate driver circuit of claim 3, wherein the first converter further comprises:
a first resistor being coupled between a source and a gate of the first transistor;
a second resistor being coupled between a source and a gate of the second transistor;
a first Zener diode having a cathode coupled to a first power source and an anode coupled to the gate of the first transistor; and
a second Zener diode of which a cathode is coupled to the first power source and an anode is coupled to the gate of the second transistor.

7. A gate driver circuit comprising:
a level shifter for outputting a first voltage pulse or a second voltage pulse according to an input SET or RESET signal;
a reshaper, receiving a voltage from a first power source and a second power source, for receiving the first voltage pulse or the second voltage pulse, restoring the first or the second voltage pulse in a high voltage region, and outputting the restored pulse;
a gate driver for generating a signal for driving a gate of a high voltage output element from the restored pulse; and
a converter, which is directly coupled between an output of the level shifter and an input of the reshaper, for erasing noise input from the first power source and converting the voltage pulse output by the level shifter into a pulse appropriate for an operational range of the reshaper, wherein the converter comprises
a first converting part for converting the first voltage pulse or the second voltage pulse output by the level shifter into a first or a second current signal; and
a second converting part for converting the converted current signal into a voltage pulse appropriate for an operational range of the reshaper, wherein
the first converting part comprises at least one Zener diode.

8. The gate driver circuit of claim 7, wherein the converter comprises
a noise eraser for detecting and erasing the noise input from the first power source.

9. The gate driver circuit of claim 8, wherein the noise eraser comprises:
a noise detector for detecting an amount of current caused by the noise, the current being output by the first converting part; and
a first to third transistors of which respective gates and sources are coupled to the same potential, and wherein the noise eraser absorbs the current caused by the noise output by the first converting part, since a current detected by the noise detector flows through the first transistor, and the current flowing through the first transistor is copied by the second and the third transistors.

10. The gate driver circuit of claim 9, wherein the first converting part comprises:
a fourth transistor and a fifth transistor for respectively receiving the first and the second voltage signals through gates, converting the received voltage signals into the first and the second current signals, and outputting them;
a first resistor which is coupled to the first power source at one end and the fourth and the fifth transistors at the other end;
a second resistor being coupled between a source and a gate of the fourth transistor; and
a third resistor being coupled between a source and a gate of the fifth transistor, and wherein the noise detector comprises a fourth resistor which is coupled to the first power source at one end, a sixth transistor being coupled between the other end of the fourth resistor and the first transistor, and a fifth resistor being coupled between a source and a gate of the sixth transistor.

11. The gate driver circuit of claim 10, wherein the level shifter comprises:
a sixth resistor having one end coupled to the first power source;
a seventh transistor, which is coupled between the other end of the sixth resistor and a ground, being turned on by the SET signal input to the gate of the seventh transistor;
a seventh resistor which is coupled to the first power source at one end; and
an eighth transistor which is coupled between the other end of the seventh resistor and the ground, being turned on by the RESET signal input to the gate of the eighth transistor, and wherein the noise detector further comprises an eighth resistor and a ninth transistor which are coupled in series between the first power source and the ground, of which a contact node is coupled to a gate of the sixth transistor.

12. The gate driver circuit of claim 8, wherein the second converting part comprises:
a ninth and a tenth resistor, which are coupled between an output end of the first converting part and the second power source, for respectively converting the first and the second current signals output by the first converting part into voltage signals; and
a tenth transistor and an eleventh transistor, of which first ends are coupled to the first power source and second ends are coupled to the second power source, for receiving the voltage signal converted by the first and the second resistors, and amplifying them.

13. The gate driver circuit of claim 9, wherein current capacities of the second and the third transistors are equal to or larger than that of the first transistor.

14. The gate driver circuit of claim 10, wherein:
current capacities of the fourth to the sixth transistors are substantially the same;
a magnitude of the fourth resistor is twice that of the first resistor; and
magnitudes of the second, the third, and the fifth resistors are substantially the same.

15. The gate driver circuit of claim 11, wherein:
current capacity of the ninth transistor is substantially the same or larger than those of the seventh and the eighth transistors; and
magnitudes of the sixth and the seventh resistors are substantially the same.

16. The gate driver circuit of claim 12, wherein:
current capacities of the tenth and the eleventh transistors are substantially the same; and
magnitudes of the ninth and the tenth resistors are substantially the same.

17. The gate driver circuit of claim 8, wherein the noise eraser comprises:
a first transistor having a gate for receiving the first voltage pulse;
a second transistor having a gate for receiving the second voltage pulse;
a third transistor of which a drain is coupled to a first current signal output terminal of the first converting part and a source is coupled to the second power source;
a fourth transistor, of which a gate is coupled to a gate of the third transistor and a drain is coupled to a drain of the second transistor, for forming a current mirror together with the third transistor;

a fifth transistor of which a drain is coupled to a second current signal output terminal of the first converting part and a source is coupled the second power source; and a sixth transistor of which a gate is coupled to a gate of the fifth transistor and a drain is coupled to a drain of the first transistor, for forming a current mirror together with the third transistor.

18. The gate driver circuit of claim 17, wherein the first converting part comprises:

a seventh and an eighth transistor for receiving the first and the second voltage signals output by the level shifter through respective gates and outputting the first and the second current signals;

a first resistor is coupled to the first power source at one end and coupled to sources of the seventh and the eighth transistors at the other end;

a second resistor being coupled between a source and a gate of the seventh transistor; and a third resistor being coupled between a source and a gate of the eighth transistor, and wherein the sources of the first and the second transistors are coupled to the first power source through the first resistor.

19. The gate driver circuit of claim 17, wherein the second converting part comprises:

a fourth and a fifth resistor, which are coupled between an output end of the first converting part and the second power source, for respectively converting the first and the second current signals output by the first converting part into voltage signals; and a ninth and a tenth transistor, of which first ends are respectively coupled to the first power source and second ends are respectively coupled to the second power source, for receiving the voltage signals converted by the fourth and the fifth resistors through respective gates and amplifying them.

20. The gate driver circuit of claim 18, wherein current capacities of the first and the second transistors are substantially the same or larger than those of the seventh and the eighth transistors.

21. The gate driver circuit of claim 17, wherein:

current capacities of the third and the fifth transistors are substantially the same;

current capacities of the fourth and the sixth transistors are substantially the same; and current capacities of the third and the fifth transistors are substantially the same or larger than those of the fourth and the sixth transistors.

22. The gate driver circuit of claim 18, wherein magnitudes of the second and the third resistors are substantially the same.

23. The gate driver circuit of claim 19, wherein:

current capacities of the ninth and the tenth transistors are substantially the same; and magnitudes of the fourth and the fifth resistors are substantially the same.

* * * * *